(12) United States Patent
Gu et al.

(10) Patent No.: US 10,756,191 B2
(45) Date of Patent: Aug. 25, 2020

(54) METHOD OF MANUFACTURING A GATE STRUCTURE FOR A NONVOLATILE MEMORY DEVICE

(71) Applicant: DB HITEK CO., LTD., Seoul (KR)

(72) Inventors: Sung Mo Gu, Cheongju-si (KR); Sung Bok Ahn, Daejeon (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/265,476

(22) Filed: Feb. 1, 2019

(65) Prior Publication Data
US 2019/0244822 A1 Aug. 8, 2019

(30) Foreign Application Priority Data
Feb. 2, 2018 (KR) .................. 10-2018-0013237

(51) Int. Cl.
| | |
|---|---|
| H01L 29/40 | (2006.01) |
| H01L 21/28 | (2006.01) |
| H01L 29/66 | (2006.01) |
| H01L 29/788 | (2006.01) |
| H01L 29/423 | (2006.01) |

(52) U.S. Cl.
CPC .. *H01L 29/40114* (2019.08); *H01L 21/28273* (2013.01); *H01L 29/42328* (2013.01); *H01L 29/66825* (2013.01); *H01L 29/7883* (2013.01)

(58) Field of Classification Search
CPC ......... H01L 29/40114; H01L 29/42328; H01L 29/7883; H01L 29/66825; H01L 21/28273; H01L 21/28; H01L 29/423; H01L 29/788; H01L 29/66
See application file for complete search history.

(56) References Cited

U.S. PATENT DOCUMENTS

| | | | | |
|---|---|---|---|---|
| 9,129,852 | B1* | 9/2015 | Lee | ............. H01L 27/115 |
| 2007/0238053 | A1* | 10/2007 | Hashimoto | ......... H01L 21/0337 430/313 |
| 2008/0093652 | A1* | 4/2008 | Okajima | ........... H01L 21/76897 257/315 |

\* cited by examiner

*Primary Examiner* — Thanh T Nguyen
(74) *Attorney, Agent, or Firm* — Patterson Thuente Pedersen, P.A.

(57) ABSTRACT

A method of manufacturing a gate structure for a nonvolatile memory device is disclosed. A tunneling oxide layer is formed on a substrate, and then a first polysilicon layer, a gate dielectric layer, a second polysilicon layer and a hard mask pattern are sequentially formed on the tunneling oxide layer. Then, the second polysilicon layer, the gate dielectric layer, and the first polysilicon layer are patterned through an etching process using the hard mask pattern to form stacked memory gates on the tunnel oxide layer, each including a floating gate, a gate dielectric layer pattern and a control gate on the tunneling oxide layer, and a select gate provided between the memory gates on the tunneling oxide layer.

6 Claims, 4 Drawing Sheets

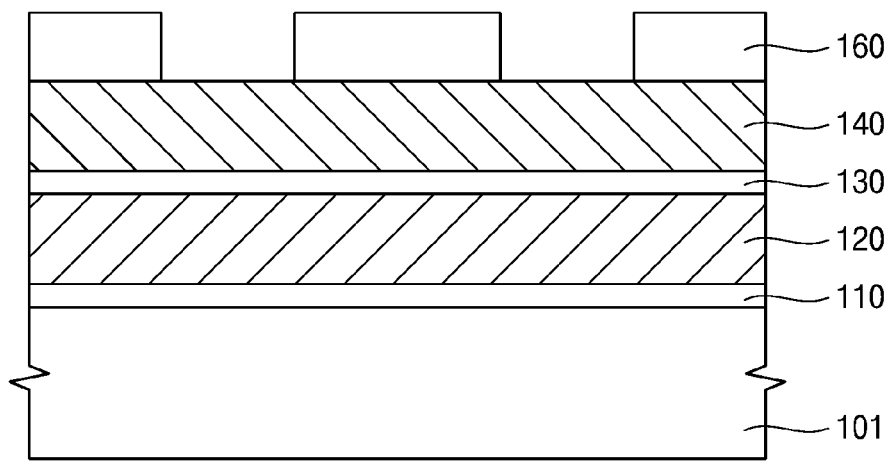
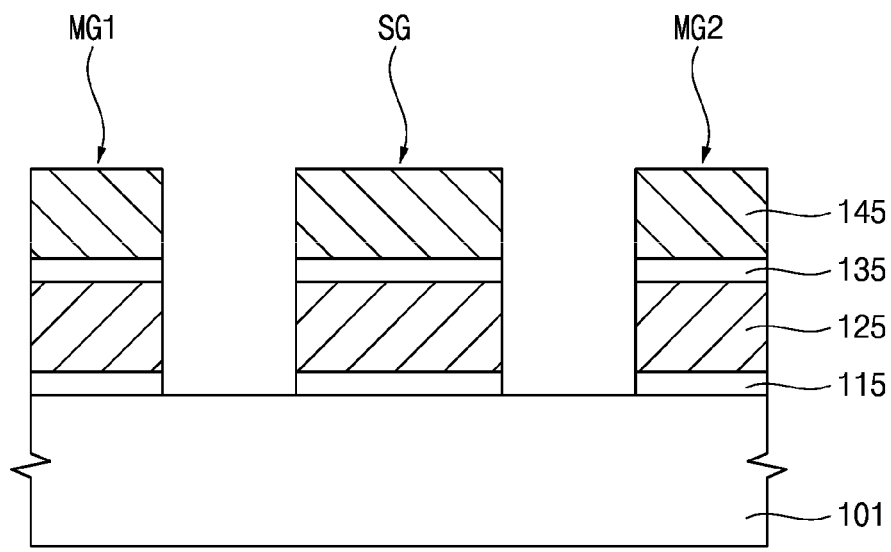

METHOD OF MANUFACTURING A GATE STRUCTURE FOR A NONVOLATILE MEMORY DEVICE

CROSS-REFERENCE TO RELATED APPLICATIONS

This application claims priority to Korean Patent Application No. 10-2018-0013237, filed on Feb. 2, 2018 and all the benefits accruing therefrom under 35 U.S.C. § 119, the contents of which are incorporated by reference in their entirety.

TECHNICAL FIELD

The present disclosure relates to a method of manufacturing a gate structure for a non-volatile memory device. More particularly, the present disclosure relates to a gate structure for a non-volatile memory device including a memory gate and a select gate.

BACKGROUND

Non-volatile memory devices are configured to store information in an electrically insulated storage. A non-volatile memory device is typically classified as a stack gate memory device or a split gate memory device, or an electrically erasable programmable read-only memory (EEPROM).

A conventional split-gate memory device includes a memory gate having a floating gate and a control gate stacked thereon, and a select gate formed by filling a trench between the memory gates with polysilicon.

To form the select gate, a tunnel oxide layer is formed on a portion of the substrate, exposed between the memory gates, and spacers are provided on the sidewalls of the memory gates. Then, a polysilicon layer is formed on the tunnel oxide layer, and a select gate is formed through a planarization process and an ion implantation process against the polysilicon layer. That is, after forming a polysilicon layer, the select gate is additionally formed through a planarization process and an ion implantation process against the polysilicon layer. Then, a split gate memory element having a split gate structure may be manufactured.

In order to form the select gate as described above, a deposition process must be used for forming the polysilicon layer, and a planarization process and an ion implantation process must be used against the polysilicon layer, both of which processes must be performed independent from the memory gate. Therefore, there is a problem that the manufacturing process of the split gate memory device is complicated and requires unacceptably high levels of process time.

SUMMARY

The example embodiments of present invention provide a method of manufacturing a gate structure for a nonvolatile memory device capable of decreasing a process time through a simplified process.

According to an example embodiment of the present invention, a tunneling oxide layer is formed on a substrate, and then a first polysilicon layer is formed on the tunneling oxide layer. Next, after forming a gate dielectric layer on the first polysilicon layer, a second polysilicon layer is formed on the gate dielectric layer and a hard mask pattern is formed on the second polysilicon layer. Then, the second polysilicon layer, the gate dielectric layer and the first polysilicon layer are patterned through an etching process using the hard mask pattern to form memory gates on the tunnel oxide layer, each including a floating gate, a gate dielectric layer pattern and a control gate stacked on the tunneling oxide layer, and a select gate provided between the memory gates and on the tunneling oxide layer.

In an example embodiment, each of the memory gate and the select gate may be formed to have a stacked structure including a first polysilicon layer pattern, a gate dielectric layer pattern and a second polysilicon layer pattern.

In an example embodiment, patterning the first polysilicon layer may include performing a chemical-dependent etch process.

In an example embodiment, patterning the first polysilicon layer may include performing an isotropic etching process.

In an example embodiment, the gate dielectric layer may be formed to have an ONO structure including an oxide thin film, a nitride thin film and an oxide thin film sequentially stacked.

According to an example embodiment of the present invention for manufacturing a gate structure for a nonvolatile memory device, a tunneling oxide layer is formed on a substrate, and a first polysilicon layer is formed on the tunneling oxide layer. After forming a photoresist pattern on the first polysilicon layer, a etching process is performed using the photoresist pattern as etch mask against the first polysilicon layer to transform the first polysilicon layer into a first polysilicon layer pattern including floating gates and a select gate disposed between the floating gates. Next, after forming a gate dielectric layer on the tunneling oxide including the floating gates and the select gate, a second polysilicon layer is formed on the gate dielectric layer, and a hard mask pattern is formed on the second polysilicon layer. Then, the second polysilicon layer and the gate dielectric layer are sequentially patterned through an etching process using the hard mask pattern to form a second polysilicon layer pattern, a gate dielectric layer pattern on each of the floating gates.

In an example embodiment, patterning the first polysilicon layer may include performing a chemical-dependent etch process.

In an example embodiment, patterning the first polysilicon layer may include performing an isotropic etching process.

In an example embodiment, forming the first polysilicon layer pattern, the gate dielectric layer pattern, and the second polysilicon layer pattern on the tunneling oxide layer may include forming memory gates, each having a floating gate, a gate dielectric layer pattern and a control gate in a stacked structure, and a select gate provided between the memory gates.

In an example embodiment, each of the memory gates may have a stacked structure having the first polysilicon layer pattern, the gate dielectric layer pattern and the second polysilicon layer pattern, and the select gate has the second polysilicon layer pattern.

In an example embodiment, the gate dielectric layer may be formed to have an ONO structure including an oxide thin film, a nitride thin film and an oxide thin film sequentially stacked.

As described above, according to the method for forming a gate structure for a nonvolatile memory device in accordance with example embodiments of the present invention, the memory gates and the select gate, each including the first polysilicon layer pattern, the gate dielectric layer pattern and the second polysilicon layer pattern are simultaneously formed. Thus, in order to form the select gate independently, steps of forming a polysilicon layer additionally, of planarizing the polysilicon layer, and of implanting dopants into the polysilicon layer may be omitted.

Further, since the first and second memory gates and the select gate have a stack structure identical to one another, a bias voltage having the same magnitude may be applied to control gates included in the first and second memory gates and the select gate for driving a nonvolatile memory device including the gate structure. Therefore, the nonvolatile memory device may be simply operated On the other hand, each of the first and second memory gates includes the first polysilicon layer pattern, the gate dielectric layer pattern and the second polysilicon layer pattern, whereas the select gate includes a first polysilicon layer pattern. Thus, the first and second memory gates and the select gate have different structures so that the inhibit bias characteristics of the non-volatile memory device may be improved.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Subject matter hereof may be more completely understood in consideration of the following detailed description of various embodiments in connection with the accompanying figures.

FIGS. 1 to 3 are cross-sectional views illustrating a method of forming a gate structure for a nonvolatile memory device in accordance with an example embodiment of the present disclosure;

Figure 3:
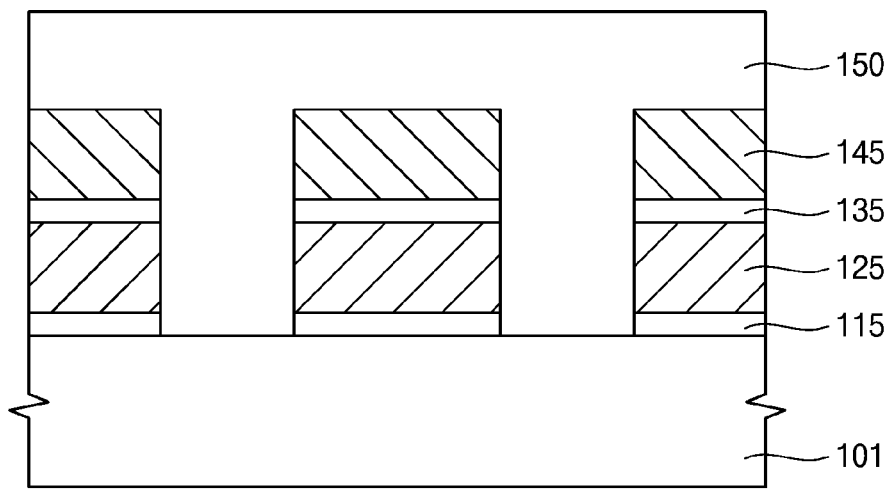

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, specific embodiments will be described in more detail with reference to the accompanying drawings. The present disclosure may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, film, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present disclosure.

FIGS. 1 to 3 are cross-sectional views illustrating a method of forming a gate structure for a nonvolatile memory device in accordance with an example embodiment of the present disclosure.

Referring to FIG. 1, according to a method of manufacturing a gate structure for a nonvolatile memory device in accordance with an example embodiment of the present invention, a tunneling oxide layer 110 is formed on a substrate 101. The tunneling oxide layer 110 may be formed through a chemical vapor deposition process. The chemical vapor deposition process may be performed at a temperature of about 700 to 900° C. in an oxygen atmosphere. Alternatively, the tunneling oxide layer 110 may be formed through a thermal oxidation process for oxidizing an upper surface portion of the substrate 101.

Meanwhile, the substrate 101 may include a silicon substrate. Further, the substrate 101 may correspond to a substrate having a first conductivity type with being doped with low-concentration impurities in the silicon substrate.

A first polysilicon layer 120 is formed on the tunneling oxide layer 110. The first polysilicon layer 120 may be formed through a low pressure chemical vapor deposition process. The first polysilicon layer 120 may be formed to have a thickness of about 1,000 to about 5,500 Å. The first polysilicon layer 120 may be doped with dopants of Group V element. As a result, the first polysilicon layer 120 may have an increased electrical conductivity.

A gate dielectric layer 130 is formed on the first polysilicon layer 120. The gate dielectric layer 130 may be formed through a low pressure chemical vapor deposition process. The low pressure chemical vapor deposition process may be performed within a temperature in a range of about 700 to about 800° C.

In an example embodiment of the present invention, the gate dielectric layer 130 may be formed to have an Oxide-Nitride-Oxide (ONO) structure in which a first oxide thin film, a nitride thin film and a second oxide thin film are sequentially stacked on the first polysilicon layer 120. That is, the first oxide thin film may have a thickness of about 50 to about 70 Å, the nitride thin film may have a thickness of about 60 to about 80 Å, and the second oxide thin film may have a thickness of about 50 to about 70 Å.

Next, a second polysilicon layer 140 is formed on the gate dielectric layer 130. The second polysilicon layer 140 may be formed through a low pressure chemical vapor deposition process. The second polysilicon layer 140 may be formed to have a thickness of about 1,000 to 5,500 Å.

Next, a hard mask pattern 160 is formed on the second polysilicon layer 140. The hard mask pattern 160 may function as a mask pattern in a subsequent patterning process. The hard mask pattern 160 may be formed using, for example, silicon nitride.

In order to form the hard mask pattern 160, a hard mask layer (not shown) is formed on the second polysilicon layer 140 through a chemical vapor deposition process. The hard mask layer is partially etched through an etching process to form a hard mask pattern 160 on the second polysilicon layer 140.

Referring to FIG. 2, an etching process using the hard mask pattern 160 as an etch mask is performed. Thus, the second polysilicon layer 140, the gate dielectric layer 130 and the first polysilicon layer 120 are patterned to form the first memory gate MG1, a select gate SG and a second memory gate MG2 on the substrate 101. At this time, the second polysilicon layer 140, the gate dielectric layer 130, the first polysilicon layer 120 and the tunneling oxide layer 110 of FIG. 1 are transformed into a second polysilicon layer pattern 145, a gate dielectric layer pattern 135, a first polysilicon layer pattern 125 and a tunneling oxide layer pattern 115 as shown in FIG. 2, respectively.

A dry etching process may be further performed, prior to sequentially patterning the second polysilicon layer 140, the gate dielectric layer 130, and the first polysilicon layer 120.

Each of the first and second memory gates MG1 and MG2 and the select gate SG has the first polysilicon layer pattern 125, the gate dielectric layer pattern 135, and the second polysilicon layer pattern 145. Therefore, in order to form the select gate SG, an additional process including a step of forming a polysilicon layer additionally, a step of planarizing the polysilicon layer, and a step of implanting dopants into the polysilicon layer may be omitted. Thus, a process for manufacturing a gate structure for a split typed nonvolatile memory device may be simplified.

Further, as the first and second memory gates (MG1, MG2) and the select gate (SG) have a stack structure identical to one another, a bias voltage having the same magnitude may be applied to control gates CG included in the first and second memory gates (MG1, MG2) and the select gate SG for driving a nonvolatile memory device including the gate structure. Therefore, the nonvolatile memory device may be operated simply.

In an example embodiment of the present invention, after the dry etching process for patterning the first polysilicon layer 120, a chemically dependent etching (CDE) process may additionally be performed.

Since an isotropic etch process through the chemical dependency etching process is performed, the first polysilicon layer 120 formed at a relatively deep position is effectively etched. A residue from the first polysilicon layer 120 may be prevented from remaining on the tunneling oxide layer 110. Thus, a bridging phenomenon in which the first polysilicon layer patterns 125 are interconnected between each other by the residue may be suppressed. As a result, a leakage current phenomenon of the nonvolatile memory device having the gate structure may be suppressed.

Referring to FIG. 3, a PMD (pre-metallic dielectric) layer 150 may be formed between the first memory gates MG1 and MG2 and the select gate SG. Metal wirings (not shown) for applying a voltage to a source region and a drain region formed on the substrate 101 may be formed on the PMD layer.

Figure 4:
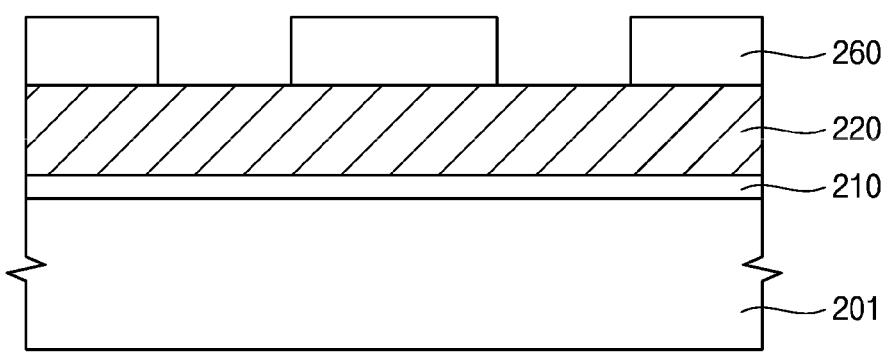
FIGS. 4 to 6 are cross-sectional views illustrating a method of forming a gate structure for a nonvolatile memory device in accordance with an example embodiment of the present disclosure.
Figure 5:
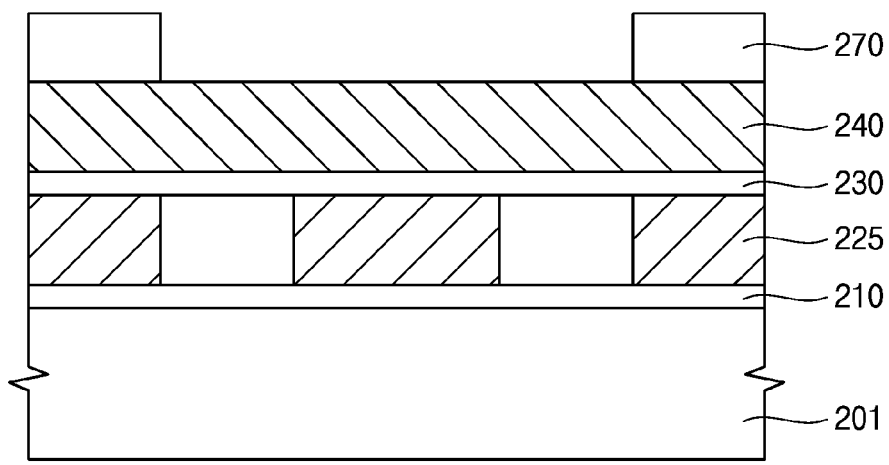
Figure 6:
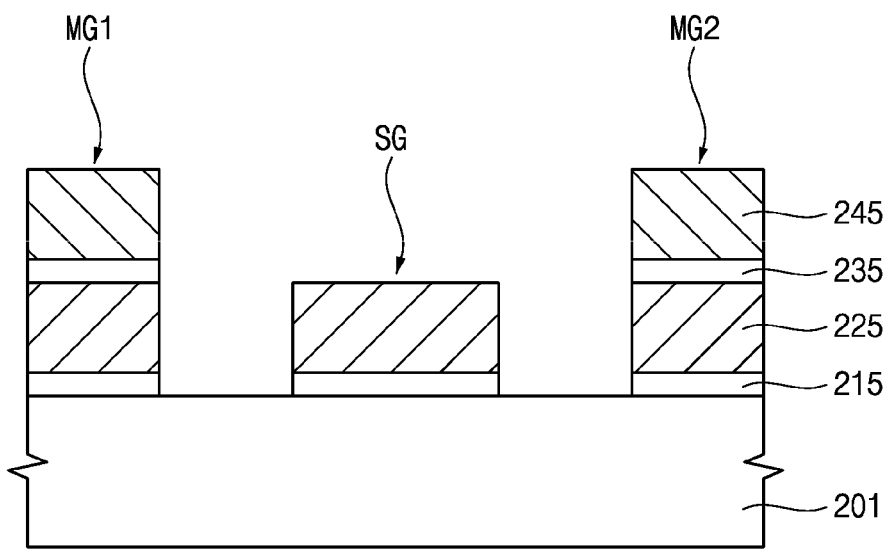

FIGS. 4 to 6 are cross-sectional views illustrating a method of forming a gate structure for a nonvolatile memory device in accordance with an example embodiment of the present disclosure.

Referring to FIG. 4, according to a method of manufacturing a gate structure for a nonvolatile memory device in accordance with an embodiment of the present disclosure, a tunneling oxide layer 210 is formed on a substrate 201. The tunneling oxide layer 210 may be formed through a chemical vapor deposition process in an oxygen atmosphere at a temperature in a range from about 700 to about 900° C. Alternatively, the tunneling oxide layer 210 may be formed through a thermal oxidation process for oxidizing an upper surface portion of the substrate 201.

Next, a first polysilicon layer 220 is formed on the tunneling oxide layer 210. The first polysilicon layer 220 may be formed through a low pressure chemical vapor deposition process. The first polysilicon layer 220 may be formed to have a thickness of about 1,000 to 5,500 Å. The first polysilicon layer 220 may be doped with dopants of Group V element. Therefore, the first polysilicon layer 220 may have an increased electrical conductivity. The first polysilicon layer 220 may be patterned through a subsequent patterning process and converted into a memory gate and a select gate.

Next, a photoresist pattern 260 is formed on the first polysilicon layer 220. The photoresist pattern 260 may have a shape corresponding to those of the memory gate and the select gate. In detail, a photoresist layer (not shown) is formed on the first polysilicon layer 220. Then, an exposure process and a development process against the photoresist layer using a mask provided on the photoresist layer are performed to form the photoresist pattern 260 on the first polysilicon layer 220.

Referring to FIG. 5, the first polysilicon layer 220 is partially etched through an etching process using the photoresist pattern 260 as an etch mask to form a first polysilicon layer pattern 225.

The first polysilicon layer pattern 225 may correspond to a floating gate and a select gate of a memory gate to be formed subsequently.

After the photoresist pattern 260 is removed, a gate dielectric layer 230 is formed on the first polysilicon layer pattern 225. The gate dielectric 230 may be formed through a low pressure chemical vapor deposition process. The low pressure chemical vapor deposition process may be performed within a temperature range of about 700 to about 800° C.

Next, a second polysilicon layer 240 is formed on the gate dielectric 230. The second polysilicon layer 240 may be formed through a low pressure chemical vapor deposition process. The second polysilicon layer 240 may be formed to have a thickness of about 1,000 to about 5,500 Å.

Referring to FIG. 5 again, a hard mask pattern 270 is formed on the second polysilicon layer 240. The hard mask pattern 270 may function as a mask pattern in a subsequent patterning process. The hard mask pattern 270 may expose a formation region of the select gate. As a result, a portion of the second polysilicon layer 240 located in the formation region of the select gate may be removed in a subsequent etching process.

Meanwhile, the hard mask pattern 270 is formed using, for example, silicon nitride.

In order to form the hard mask pattern 270, a hard mask layer (not shown) is formed on the second polysilicon layer 240 through a chemical vapor deposition process. The hard mask layer is partially etched through an etching process to form a hard mask pattern 270 on the second polysilicon layer 240.

Referring to FIG. 6, an etching process using the hard mask pattern 270 as an etching mask is performed. The second polysilicon layer 240 and the gate dielectric layer 230 are sequentially patterned to form the first memory gate MG1, the select gate SG, and the second memory gate MG2 on a tunneling oxide layer pattern 215. At this time, the second polysilicon layer 240, the gate dielectric layer 230 and the tunneling oxide layer are transformed to a second polysilicon layer pattern 245, a gate dielectric layer pattern 235 and the tunneling oxide layer pattern, respectively.

A dry etching process may be further performed, prior to patterning the second polysilicon layer 240, the gate dielectric layer 230, and the first polysilicon layer 220.

Here, each of the first and second memory gates MG1 and MG2 includes a first polysilicon layer pattern 225, a gate dielectric layer pattern 235, and a second polysilicon layer pattern 245.

On the other hand, the select gate SG includes the first polysilicon layer pattern 225, but does not include the gate dielectric layer pattern and the second polysilicon layer pattern.

When the nonvolatile memory device including the gate structure is driven, the select gate may or may not select a specific address. In particular, while the nonvolatile memory device operates to erase/write data, a select bias is applied to a predetermined address to operate the memory gate selected by the select gate to which the select bias is applied, whereas an inhibit bias is applied to a predetermined address to suppress a memory gate unselected by an unselected gate to which the inhibit bias is applied from operating. At this time, inhibit bias characteristics may be improved since the memory gate and the select gate have the stack structure substantially identical to each other.

On the other hand, in an example embodiment of the present invention, each of the first and second memory gates MG1 and MG2 includes the first polysilicon layer pattern 225 and the gate dielectric layer pattern 235, whereas the select gate SG includes only the first polysilicon layer pattern 225. Thus, the first and second memory gates (MG1, MG2) have structures different from that of the select gate (SG). Accordingly, the inhibit bias characteristic of the nonvolatile memory element may be improved.

Figure 7:
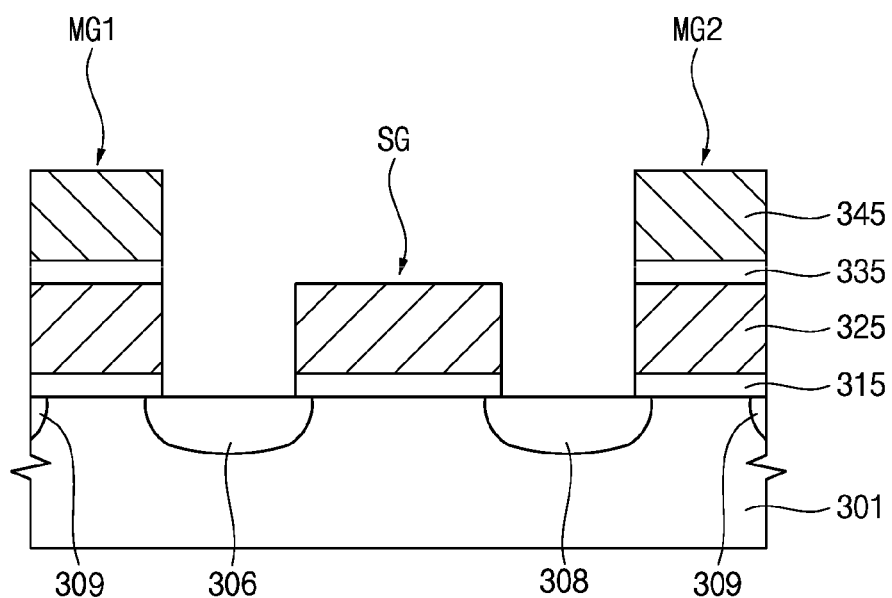
FIG. 7 is a cross-sectional view illustrating a method of manufacturing a nonvolatile memory device in accordance with an example embodiment of the present disclosure.

FIG. 7 is a cross-sectional view illustrating a method of manufacturing a nonvolatile memory device in accordance with an example embodiment of the present invention.

Referring to FIG. 7, in a method of manufacturing a nonvolatile memory device according to an example embodiment of the present invention, a gate structure, a source region 306, and a drain region 308 are formed.

The method of forming the gate structure has been described in detail with reference to FIGS. 1 to 6, and a detailed description thereof will be omitted.

The source region 306 and the drain region 308 are formed in the substrate 301 between the memory gates MG1 and MG2 and the selection gate SG.

The source region 306 and the drain region 308 may be formed through an ion implantation process in which high-concentration dopants are implanted into the substrate. Although the method of manufacturing the gate structure of the nonvolatile memory device have been described with reference to the specific embodiments, they are not limited thereto. Therefore, it will be readily understood by those skilled in the art that various modifications and changes can be made thereto without departing from the spirit and scope of the appended claims.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

The invention claimed is:

1. A method of manufacturing a gate structure for a nonvolatile memory device, the method comprising:
    forming a tunneling oxide layer on a substrate;
    forming a first polysilicon layer on the tunneling oxide layer;
    forming a photoresist pattern on the first polysilicon layer;
    performing a etching process using the photoresist pattern as etch mask against the first polysilicon layer to transform the first polysilicon layer into a first polysilicon layer pattern including floating gates and a select gate disposed between the floating gates;
    forming a gate dielectric layer on the tunneling oxide including the floating gates and the select gate;
    forming a second polysilicon layer on the gate dielectric layer;
    forming a hard mask pattern on the second polysilicon layer; and
    sequentially patterning the second polysilicon layer and the gate dielectric layer through an etching process using the hard mask pattern to form a second polysilicon layer pattern, a gate dielectric layer pattern on each of the floating gates.

2. The method of claim 1, wherein patterning the first polysilicon layer includes performing a chemical-dependent etch process.

3. The method of claim 1, wherein patterning the first polysilicon layer includes performing an isotropic etching process.

4. The method of claim 1, wherein forming the first polysilicon layer pattern, the gate dielectric layer pattern, and the second polysilicon layer pattern on the tunneling oxide layer includes forming memory gates, each having a floating gate, a gate dielectric layer pattern and a control gate in a stacked structure, and a select gate provided between the memory gates.

5. The method of claim 4, wherein each of the memory gates has a stacked structure including the first polysilicon layer pattern, the gate dielectric layer pattern and the second polysilicon layer pattern, and the select gate includes the second polysilicon layer pattern.

6. The method of claim 4, wherein the gate dielectric layer includes an ONO structure including an oxide thin film, a nitride thin film and an oxide thin film sequentially stacked.

* * * * *